(12) United States Patent
Przeslawski et al.

(10) Patent No.: US 8,540,010 B2
(45) Date of Patent: Sep. 24, 2013

(54) SEQUENTIAL MOLD FILLING

(75) Inventors: Brian D. Przeslawski, Liberty Township, OH (US); Rajeev V. Naik, Grafton, VA (US)

(73) Assignee: Howmet Corporation, Independence, OH (US)

( * ) Notice: Subject to any disclaimer, the term of this patent is extended or adjusted under 35 U.S.C. 154(b) by 367 days.

(21) Appl. No.: 11/787,431

(22) Filed: Apr. 16, 2007

(65) Prior Publication Data

US 2008/0014459 A1    Jan. 17, 2008

Related U.S. Application Data

(60) Provisional application No. 60/793,318, filed on Apr. 19, 2006.

(51) Int. Cl.
*B22D 35/04*    (2006.01)

(52) U.S. Cl.
USPC .......................................... 164/133; 164/337

(58) Field of Classification Search
USPC ........... 164/133–136, 335–337, 122.1, 122.2, 164/516–519
See application file for complete search history.

(56) References Cited

U.S. PATENT DOCUMENTS

| | | | | |
|---|---|---|---|---|
| 2,247,777 A * | 7/1941 | Hagemeyer | | 164/70.1 |
| 3,554,271 A | 1/1971 | Goss | | 164/137 |
| 3,685,569 A | 8/1972 | Denton | | 164/120 |
| 4,064,928 A | 12/1977 | Wunder | | 164/264 |
| 4,072,180 A * | 2/1978 | Hoult | | 164/130 |
| 4,505,318 A | 3/1985 | Tokui et al. | | 164/113 |
| 4,947,923 A | 8/1990 | Rikker | | 164/5 |
| 4,972,897 A * | 11/1990 | Thomas | | 164/35 |
| 4,981,167 A * | 1/1991 | Anderson | | 164/35 |
| 5,101,880 A | 4/1992 | Fujiwara et al. | | 164/154 |
| 5,244,187 A * | 9/1993 | Manginelli | | 164/129 |
| 5,381,851 A | 1/1995 | Bilz et al. | | 164/119 |
| 5,620,044 A | 4/1997 | Grenkowitz et al. | | 164/134 |
| 5,725,041 A | 3/1998 | Schultz | | 164/5 |
| 5,899,257 A * | 5/1999 | Alleweireldt et al. | | 164/122.2 |
| 6,063,315 A | 5/2000 | Keller et al. | | 264/40.1 |
| 6,838,034 B2 | 1/2005 | Smith et al. | | 264/297.2 |
| 6,843,954 B2 | 1/2005 | Porter | | 264/513 |
| 7,279,128 B2 | 10/2007 | Kennedy et al. | | 266/239 |
| 2002/0166651 A1 | 11/2002 | Herron | | 164/130 |

FOREIGN PATENT DOCUMENTS

EP    0 289 175 A2    11/1988

* cited by examiner

*Primary Examiner* — Kevin P Kerns (57) ABSTRACT

Method and apparatus for casting molten metal or alloy into a plurality of molds that are connected by mold ingate passages in melt flow communication to a melt supply passage which is configured in a manner to completely or partially fill the molds with the molten metal or alloy sequentially one after another. Filling of the molds in this manner provides uniform mold filling, reduces foreign matter in molds filled after the first-filled mold, and improves quality of the cast articles.

8 Claims, 11 Drawing Sheets

SEQUENTIAL MOLD FILLING

This application claims priority and benefits of provisional application Ser. No. 60/793,318 filed Apr. 19, 2006, the disclosure of which is incorporated herein by reference.

FIELD OF THE INVENTION

The present invention relates to casting of molten metal or alloy and, more particularly, to method and apparatus for casting molten metal or alloy into a plurality of molds that are connected to a molten metal or alloy supply passage in a manner that the molds are partially or completely filled with molten metal or alloy sequentially one after another.

BACKGROUND OF THE INVENTION

In the investment casting of molten metal or alloy (melt), a ceramic gang mold has been employed where the gang mold comprises a melt pour cup connected to a plurality of individual article-forming molds. In one conventional casting set-up for casting gas turbine engine blades, the pour cup includes multiple main melt supply gating spokes extending therefrom. The main gating spokes each in turn branch into multiple individual melt supply gating spokes each of which extends to a respective individual mold. For example, three or more melt supply branch gating spokes may branch from each main spoke. Each article-forming mold includes at least one mold cavity having the shape of the article to be cast.

In a conventional casting set-up, the initial stream of melt poured from a crucible into the pour cup of the mold is usually narrow to insure that the melt is received in the pour cup and that there is minimum splashing of the melt inside the casting furnace. The main gating spokes are communicated to the pour cup and typically serve the dual purpose of delivery of melt to a respective individual mold via a respective branch gating spoke and of providing an adequate reservoir of melt to compensate for the liquid-to-solid shrinkage in the mold. For example, in casting equiaxed grain articles, the cross-sectional area of the spokes therefore typically has to be larger than the cross-section of the mold cavity that is filled from the spoke. For example, in a conventional equiaxed casting set-up, the collective cross-sections of the spokes can be at least ten times larger than the initial pour stream. Such a large ratio of spoke-to-initial pour stream cross-sectional areas results in inconsistent and uneven delivery of melt among the molds. The spokes that are oriented in the direction of the pour stream receive more metal flow than those spokes which are located away from the direction of pour stream, resulting in uneven initial fill of the molds.

In the above conventional casting set-up, the need for a large number of spokes to provide both initial melt delivery and melt feeding to accommodate solidification shrinkage of individual molds is disadvantageous from the standpoint that metal or alloy usage is inefficient. That is, the metal or alloy solidified in the main and branch spokes is not cast into a usable article but remains as individual gating of the molds.

The gang mold has been formed by the well known lost wax process where a wax or other fugitive pattern assembly corresponding to the gang mold features is repeatedly dipped in ceramic slurry, drained of excess slurry, and stuccoed with coarse ceramic stucco particulates to build up a desired thickness of ceramic shell thickness on the pattern assembly. The pattern assembly then is selectively removed, and the remaining ceramic gang shell mold is heated at elevated temperature to impart strength properties to the shell mold needed for subsequent casting. During casting, molten metal or alloy is poured into the pour cup and flows via the gating to fill the article-forming molds substantially concurrently. The molten metal or alloy is solidified in the molds to form an investment cast article in the molds.

In the investment casting of critical aerospace components, such as gas turbine engine blades, vanes and the like, the gang molds oftentimes include a molten metal or alloy filter placed in each melt feed runner supplying molten metal or alloy from the pour cup to the spokes in order to remove non-metallic inclusions from the molten metal or alloy before it enters the individual molds.

SUMMARY OF THE INVENTION

The present invention provides method and mold assembly for casting molten metal or alloy (melt) that involve providing a metal or alloy melt in a melt-receiving mold cup of a mold assembly and supplying the melt from the mold cup to a melt supply passage of the mold assembly for flow to a plurality of molds that are connected in melt flow communication to the melt supply passage in series arrangement one after another. The melt supply passage is configured in a manner that each of the molds of the series is at least partially filled before the next mold in the series is at least partially filled.

In an illustrative method embodiment of the invention, the first mold in the series is completely or partially filled before a second mold of the series is filled. Then, the second mold is completely or partially filled before a third mold of the series is filled, and so on until remaining molds of the series are filled.

In another illustrative method embodiment of the invention, the first mold of the series is filled in dead-end manner without flow through a mold cavity thereof to the next mold in the series to help reduce the amount of foreign matter, such as non-metallic inclusions, in the melt filling subsequently filled molds of the series.

One illustrative embodiment for achieving dead-end filling involves completely filling a first mold of the series from a top thereof with melt from the melt supply passage, then filling a second mold of the series from a top thereof using a second melt supply passage extending from the top of the first mold to the top of the second mold, and so on until the molds are filled. Alternately, another dead-end filling method can involve filling the first mold using a single inlet passage at one end of the first mold that is remote from a closed opposite end thereof. The first mold can be an article-forming or non-article-forming mold configured to provide dead-end flow.

In practicing the method of the invention, the molds can be connected to a melt supply passage that is inclined at an acute angle along a length. Alternately, the molds can be connected to a melt supply passage that is constricted along a length to have variable cross-sections that decrease in cross-sectional area. Still further, the molds can be connected to a melt supply passage that is upstanding along its length. In a preferred embodiment of the invention, the adjacent molds of the series are connected by respective melt supply passages in a manner to provide sequential top-to-top filling of the molds.

In practicing particular embodiments of the invention, the molds can be disposed along a length of a linear or arcuate melt supply passage of a gang mold. The molds can be configured to cast equiaxed articles therein, directionally solidified articles therein having a plurality of columnar grains along an axis of the mold, or single crystal articles therein having a single oriented grain.

The invention also envisions a method and mold assembly for casting molten metal or alloy that involve providing metal or alloy melt in a melt-receiving mold cup of a mold assembly and supplying the melt from the mold cup to a first melt supply passage of the mold assembly to which a first plurality of molds are connected in melt flow relation in series arrangement one after another and supplying the melt from the first melt supply passage via a connector melt supply passage to a second supply passage to which a second plurality of molds are connected in melt flow relation in series arrangement one after another such that the first plurality of molds are at least partially filled before the second plurality of molds.

The invention also provides in still another embodiment method and mold assembly for casting molten metal or alloy involving supplying a metal or alloy melt to a plurality of molds which are connected in series arrangement one after another by respective melt supply members each connected between a top of a preceding mold to a top of the next mold in the series and completely filling each mold in the series before the next mold is filled.

The invention provides in another embodiment a metal or alloy casting comprising a plurality of solidified metal or alloy articles that are connected to linear or arcuate solidified gating wherein a first one of the metal or alloy articles connected to the gating includes more foreign matter than the remaining other solidified metal or alloy articles connected to the solidified gating. The casting can include solidified articles which are connected in series along a length of the solidified gating, which is inclined, which includes variable cross-sections, or which is upstanding. In another embodiment of the invention, the casting can include adjacent solidified articles that are connected top-to-top or top-to-bottom to one another by a respective solidified gating. The solidified articles can comprise equiaxed polycrystalline grain articles, directionally solidified columnar grain articles, single crystal articles, or composite articles.

The present invention is advantageous to provide more uniform and consistent filling of the molds in the series without major interruptions in filling thereof, more efficient usage of expensive metal and alloys being cast to reduce cost of manufacture, and in certain embodiments of the invention can reduce foreign matter, such as non-metallic inclusions and dross, in subsequently-filled articles of the sequence and resultant reduction in scrapped cast articles. Moreover, when the articles are cast by directional solidification to produce directionally solidified columnar grain or single crystal article, practice of the invention provides improved retained melt heat in the mold grain nucleation chamber to initiate directional solidification. Other advantages of the present invention will become more readily apparent from the following detailed description of the invention taken with the following drawings.

DESCRIPTION OF THE DRAWINGS

In FIG. 4, the cascading flow is provided from the top of each mold to the top of the next mold in the horizontal sequence so that each mold in the series is completely filled before the next mold is filled.

DETAILED DESCRIPTION OF THE INVENTION

Illustrative embodiments of the method and apparatus for casting molten metal or alloy into a plurality of molds involve providing metal or alloy melt in a melt-receiving mold cup of a mold assembly and supplying the melt from the mold cup to a melt supply passage of the mold assembly for flow to a plurality of molds that are connected in melt flow communication to the melt supply passage in series arrangement one after another wherein the melt supply passage is configured in a manner that each of the molds of the series is at least partially filled before the next mold in the series is at least partially filled.

Figure 1A:
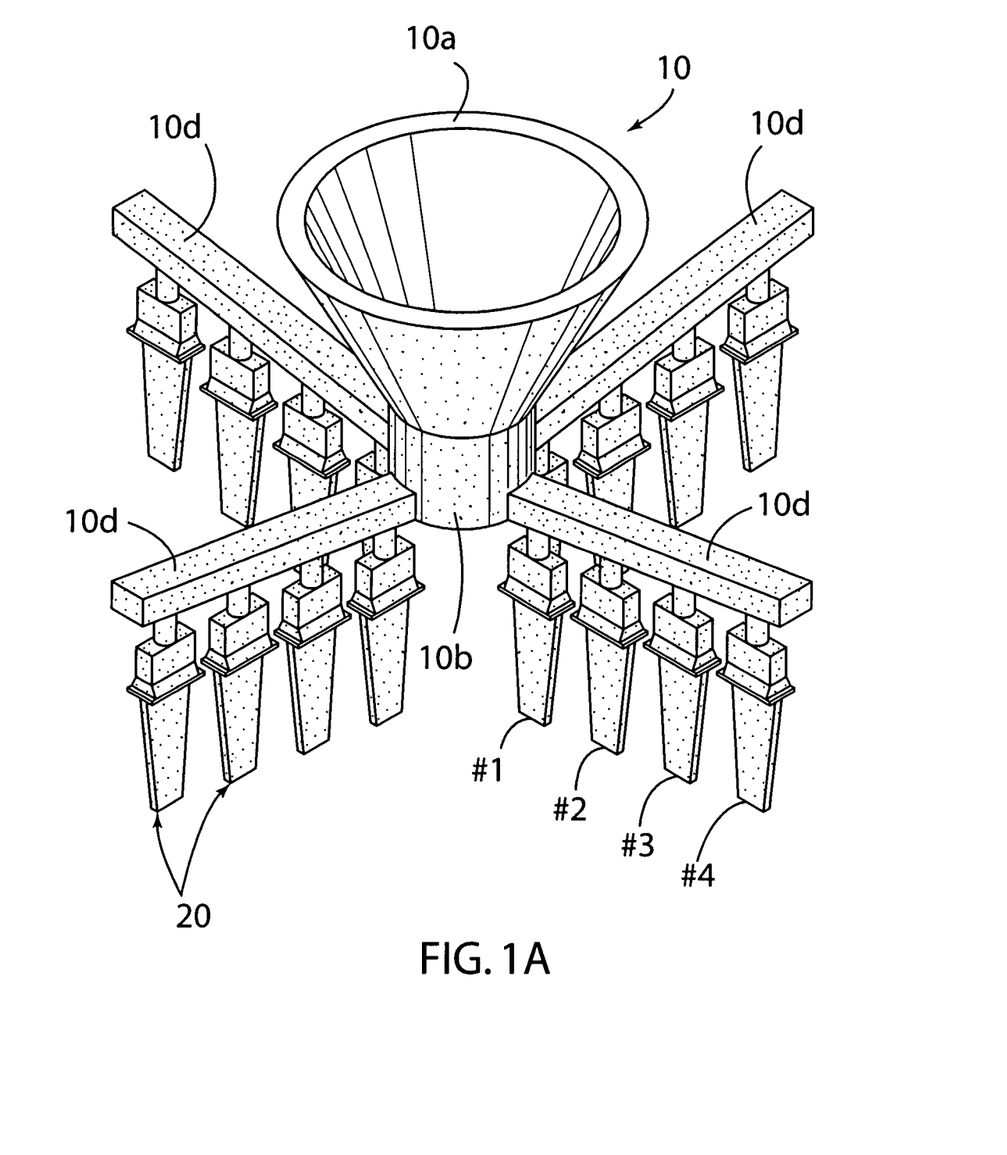
FIG. 1A is a perspective view of a gang mold assembly pursuant to an illustrative embodiment of the invention having a plurality of melt supply members extending radially from a down sprue at the bottom of the mold pour cup.
Figure 1B:
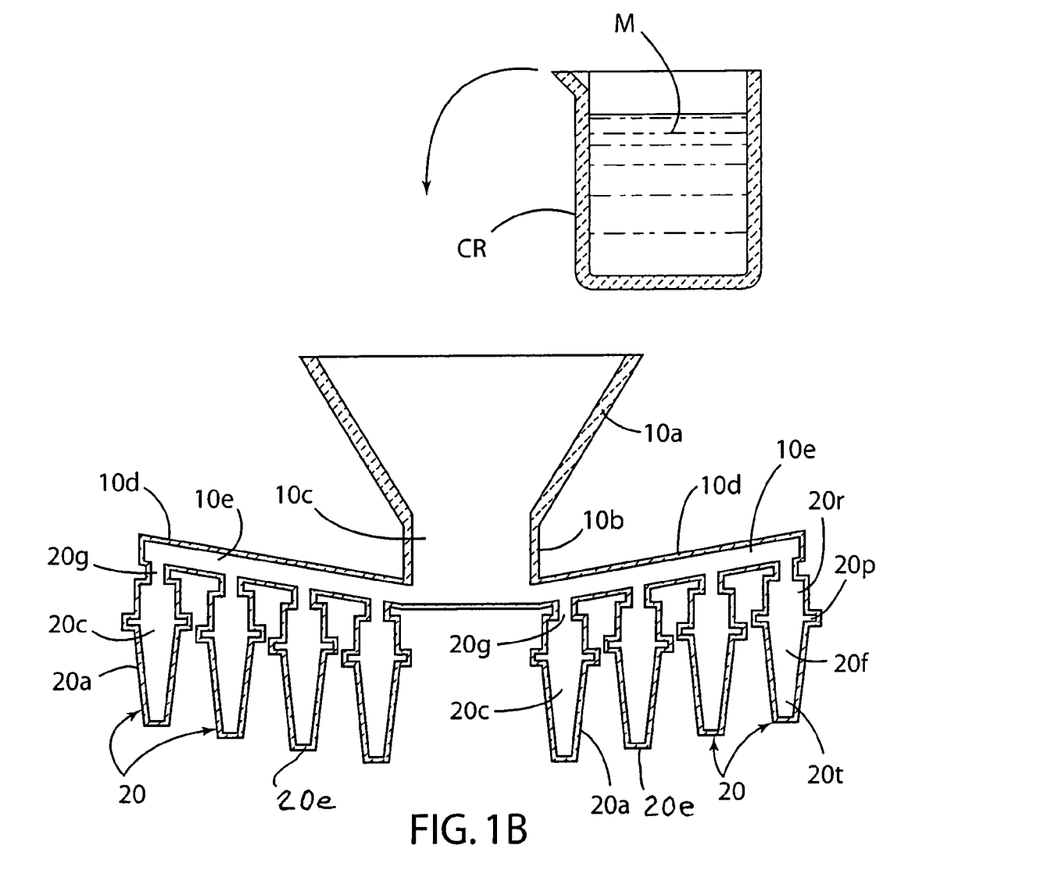
FIG. 1B is a sectional view of the gang mold assembly of FIG. 1A.
Figure 1C:
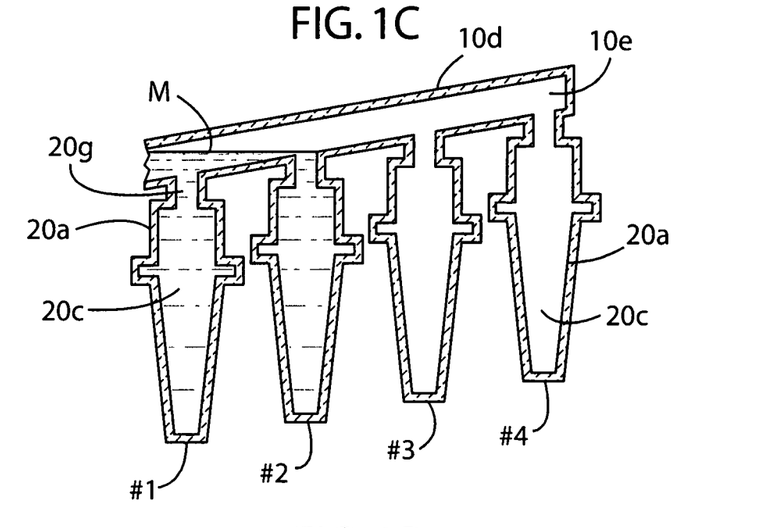
FIG. 1C is an enlarged partial sectional view of one melt supply member showing molten metal or alloy in the inclined melt supply passage relative to molds communicated to the bottom of the passage so that each mold in the series is completely filled before the next mold is filled.

FIGS. 1A, 1B, and 1C are offered to illustrate an embodiment of the invention without limiting the scope thereof. In FIGS. 1A, 1B, and 1C, a gang mold 10 is shown having an integral melt-receiving mold cup 10a, a down sprue 10b having a sprue passage 10c communicated to the mold cup 10a, and a plurality of melt supply members 10d communicated to the down sprue and each having a melt supply passage 10e. An optional conventional molten metal or alloy filter (not shown), such as for example a reticulated ceramic foam filter or cellular flow-through ceramic filter, can be typically provided in the mold cup 10a to remove foreign matter before the melt enters the molds.

Pursuant to an illustrative embodiment of the invention, a plurality of article-forming molds 20 are shown connected in melt flow communication to each of a plurality (four shown) melt supply members 10d along their respective lengths that incline upwardly relative to horizontal in a generally radial direction extending away from the mold cup 10a. Each mold 20 comprises ceramic shell 20a that includes and defines therein an article-forming mold cavity 20c that has the shape of the cast article to be produced and a closed end 20e. For purposes of illustration and not limitation, the mold cavity 20c is shown having the shape of a gas turbine engine blade, although the mold cavities can be any shape to produce a desired cast article. To this end, the mold cavity includes a blade root region 20r, blade platform region 20p, a blade airfoil region 20f and a blade tip region 20t. The mold cavity 20c is connected by a mold ingate passage 20g that is communicated in flow relation to the respective melt supply passage 10e to receive molten metal or alloy therefrom when the molten metal or alloy is provided in the mold cup 10a and flows through the down sprue and sprue passage 10e. The molten metal or alloy can be poured into the mold cup 10a from a conventional crucible CR, such as a conventional tiltable crucible or bottom feeding crucible located above the mold cup, or any other melt-containment vessel. Alternately, the metal or alloy may be placed as a solid charge in the mold cup 10a and melted in-situ therein by induction melting, electron beam melting, or other melting process. The molten metal or alloy can be melted and/or held in the crucible or other melt-containment vessel under vacuum, protective atmosphere, or air depending on the particular molten metal or alloy to be cast.

The gang mold 10 can be formed as a ceramic shell mold assembly by the well known lost wax process where a wax or other fugitive pattern assembly having the features corresponding to those of the gang mold (e.g. wax mold cup, wax down sprue, wax melt supply members, and wax molds) is assembled. The fugitive pattern assembly is repeatedly dipped in ceramic slurry, drained of excess slurry, and stuccoed with coarse ceramic stucco particulates to build up a desired thickness of ceramic shell thickness on the pattern assembly. The pattern assembly then is selectively removed, and the remaining ceramic shell gang mold is heated at elevated temperature to impart strength properties to the shell mold needed for subsequent casting.

During casting, molten metal or alloy M, FIG. 1B, can be poured from the crucible CR or other melt-containment vessel into the mold cup 10a for flow by gravity through the down sprue 10b and the gating passages 10e. Pursuant to an embodiment of the invention, the molten metal or alloy M flows from the down sprue through the inclined melt supply passages 10e to fill the article-forming mold cavities 20c in sequence depending upon the position of the mold 10 along the length of the melt supply member 10d. For example, referring to FIG. 3, the molten metal or alloy M flows into mold #1 to completely fill it first, then the flows into mold #2 to completely fill it second, then the flows into mold #3 to completely fill it third, and finally flows into mold #4 to completely fill it last. The molten metal or alloy M is solidified in the molds to form an investment cast article in each mold 20. The cast articles are connected to the solidified gating and down sprue and mold cup when the mold material is removed. After the mold material is removed, the cast articles are separated from the gating by cutting, sawing, breaking off at a cast-in notch, or any other separation technique.

In FIGS. 1A through 1D, the molds 20 are shown to produce equiaxed polycrystalline investment cast articles in the mold cavities 20c, although the invention is not limited in this regard since any type of cast article such as a columnar grain article, single crystal article, or composite article can be produced by practice of the invention.

Filling of the molds 20 in this sequential manner has been found to be advantageous to provide more uniform and consistent filling of the molds in the series without major interruptions in filling thereof. This improves the consistency and quality of the cast articles in the molds 20. Moreover, filling of the molds 20 in this sequential manner provides more efficient usage of expensive metal and alloys being cast to reduce cost of manufacture. Practice of the invention can achieve a reduction in cast articles scrapped for porosity defects, grain defects, and radiographic-revealed defects such as non-metallic inclusions and visual defects such as non-metallic inclusions. Practice of certain embodiments of the invention can produce a reduction of foreign matter, such as non-metallic inclusions and dross, in subsequently-filled molds (e.g. molds #2-#4) of the sequence and resultant reduction in scrapped cast articles. As is known, non-metallic inclusions can be detrimental to the mechanical properties of the articles solidified in the molds, such as for example reducing the tensile, rupture and fatigue life of the cast articles in service. In aerospace applications, reduced levels of non-metallic inclusions in the metal or alloy articles solidified in molds #2, #3, #4, and so on are highly desirable and/or oftentimes required by the end user of articles, such as turbine engine or airframe manufacturers. The cast article produced in mold #1 can be discarded, reworked, or remelted to recover the metal or alloy.

Figure 1D:
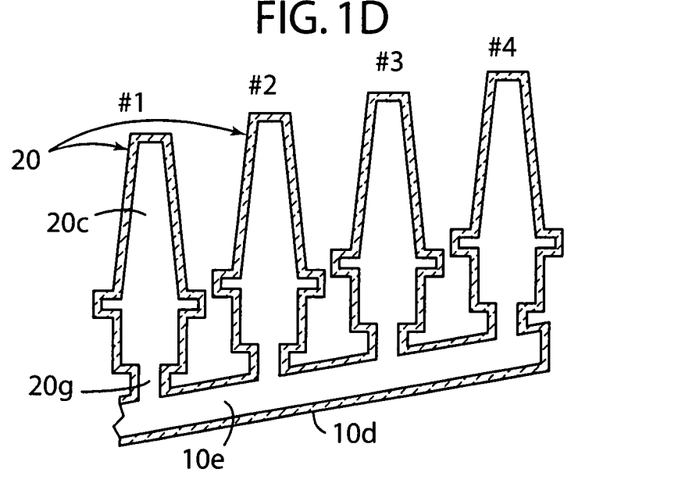
FIG. 1D is an enlarged partial sectional view of an alternative melt supply member showing molds communicated to the top of the inclined passage so as to be partially sequentially filled.

Referring to FIG. 1D, another illustrative embodiment of the invention envisions disposing the article-forming molds 20 above the inclined melt supply member 10d to communicate in flow relation with melt supply passage 10e. As shown in FIG. 1D, the melt supply member 10d is inclined at an acute angle relative to horizontal.

In FIGS. 1A through 1D as well as in the remaining FIGS. 2 through 14, like reference numerals are used to designate like or similar features or elements.

Figure 2:
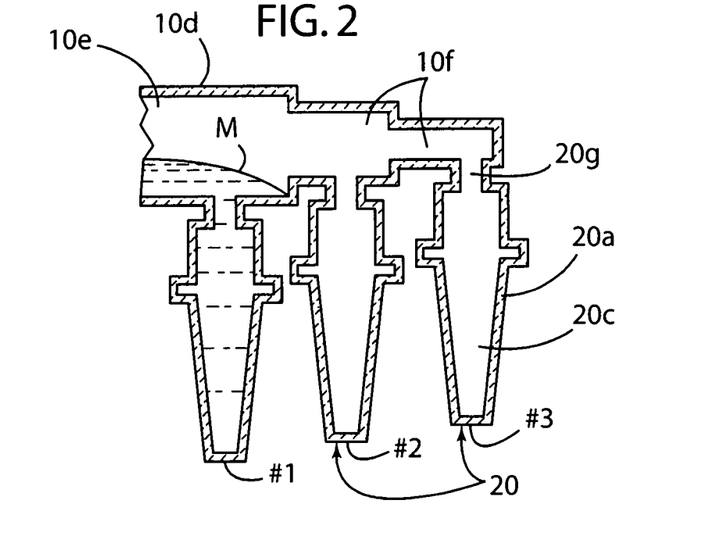
FIG. 2 is an enlarged partial sectional view of another illustrative melt supply member showing molten metal or alloy in a non-inclined melt supply passage having variable cross-sections (constrictions) that decrease in cross-sectional area in a direction away from the mold pour cup so that each mold in the series is completely filled before the next mold is filled.

Referring to FIG. 2, still another illustrative embodiment of the invention involves connecting the article-forming molds 20 in series sequence in melt flow communication to a melt supply member 10d having a melt supply passage 10e that includes variable cross-sections (constrictions) 10f that decrease in cross-sectional area in a direction away from the mold cup. The molds 20 are communicated in melt flow communication via a mold gate passage 20g to respective cross-sections (constrictions) 10f of the melt supply passage 10e such that the molds are filled sequentially during casting. That is, the molten metal or alloy M flows into mold #1 to completely fill it first, then the flows into mold #2 to completely fill it second, and finally flows into mold #3 to completely fill it last. Although the melt supply member 10d is shown as being horizontal in FIG. 2, it can be inclined relative to horizontal as well.

Figure 3:
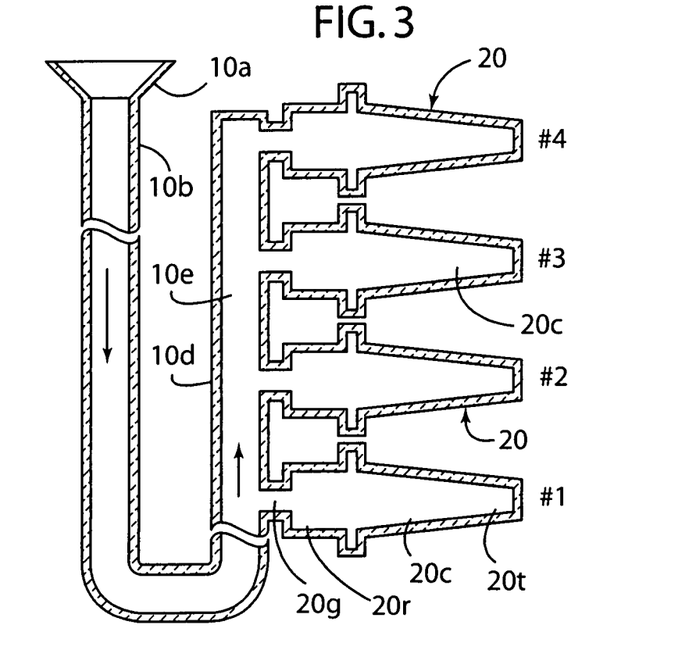
FIG. 3 is a sectional view of a gang mold assembly pursuant to another illustrative embodiment of the invention where the molds are connected in sequence along an upstanding melt supply member in a manner that the molds are filled horizontally and sequentially during gravity casting and that each mold in the series is completely filled before the next mold is filled.

Referring to FIG. 3, a further illustrative embodiment of the invention involves connecting the article-forming molds 20 in melt flow communication to a gating spoke 10s extending from an upstanding melt supply member 10d. The melt supply member 10d includes an upstanding melt supply passage 10e such that the molds 20 are supplied with molten metal or alloy generally horizontally through respective mold ingate passages 20g. The molds are filled in sequence by the molten metal or alloy M flowing into mold #1 to completely fill it first, then flowing into mold #2 to completely fill it second, then flowing into mold #3 to completely fill it third, and finally flows into mold #4 to completely fill it last. The molten metal or alloy is poured into mold cup 10a and flows by gravity downwardly through the down sprue 10b and then upwardly by metallostatic pressure and gravity through the melt supply passage 10e into the molds. The molds 20 can be oriented horizontally as shown or angled downwardly with the tip regions 20t lower than the root regions 20r.

Figure 4:
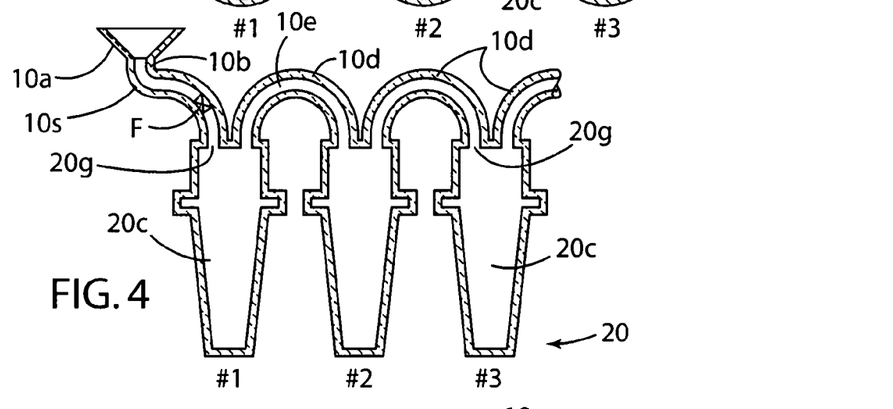
FIG. 4 is a sectional view of a gang mold assembly having the molds connected by arc-shaped sequential melt supply members to provide a cascading top-to-top flow of molten metal or alloy from the first mold in the sequence to the second mold in the sequence to the third mold in the sequence and so on such that the molds are filled sequentially during gravity casting.

Referring to FIG. 4, a still further illustrative embodiment of the invention involves providing metal or alloy melt in a melt-containing mold cup 10a of a mold assembly and supplying the melt from the mold cup 10a to a melt supply spoke 10s of the mold assembly for flow to a plurality of molds 20, the first of which is connected in direct melt flow communication to the passage of the melt supply spoke 10s from the mold cup and the subsequent of which are connected in series arrangement one after another by respective melt supply members 10d each connected between a top of a preceding mold to the top of the next mold in the series. In particular, this embodiment involves connecting the article-forming molds 20 in sequence by respective sequential melt supply passages 10e of the melt supply members 10d connected to mold ingate passages 20g as shown to provide a cascading top-to-top flow of molten metal or alloy from the top of the first mold #1 in the sequence to the top of the second mold #2 in the sequence to the top of the third mold #3 in the sequence and so on such that the molds are filled sequentially during casting. The series of sequential melt supply members 10d and interconnected molds 20 can extend in any pattern relative to the mold cup 10a or down sprue 10b. For example, the series of sequential melt supply members 10d and interconnected molds 20 can extend in a linear manner or in circular or other arcuate manner relative to the mold cup and/or down sprue.

Referring to FIG. 4, the cascading flow of the molten metal or alloy is provided from the top of the mold cavity 20c of each mold 20 to the top of the mold cavity of the next mold 20 in the sequence such that there is no melt flow through the mold cavity 20c of the preceding mold in the series directly to the next mold in the series and, instead, the melt flow deadends in each mold cavity 20c of the series of the molds 20. In particular, a first melt supply member 10d having passage 10e is provided to supply the molten metal or alloy to the top ingate passage 20g of the mold cavity 20c of the first-filled mold #1 from the pour cup 10a (or down sprue) and a second gating member 10d is provided to supply the molten metal or alloy from the first filled mold #1 to the top of the mold cavity 20c of the next mold #2 to be filled in the sequence and so on for the next molds.

The molds are filled in sequence by the molten metal or alloy flowing from the mold cup 10a (or the down sprue) into mold #1 to completely fill it first, then flowing by cascading from mold #1 into mold #2 to completely fill it second, then flowing by cascading into mold #3 to completely fill it third, and flowing into the next mold to completely fill it, and so on until all of the molds are filled with the molten metal or alloy.

Although the sequential melt supply members are shown as arc-shaped melt supply members 10d, any suitable shape and cross-sectional size of the melt passage 10e therein can be used. For example, the melt supply members 10d can be made of linear and/or curved segments to provide an inverted C-shape or inverted loop shape, or any other shape that provides the cascading flow from the top of the preceding mold to the next mold in the series.

An optional conventional molten metal or alloy filter F, such as for example a reticulated ceramic foam filter or cellular flow-through ceramic filter, can be provided in the passage of the melt supply spoke 10s to remove foreign matter, such as dross and non-metallic inclusions, before the melt enters the molds.

Figure 4A:
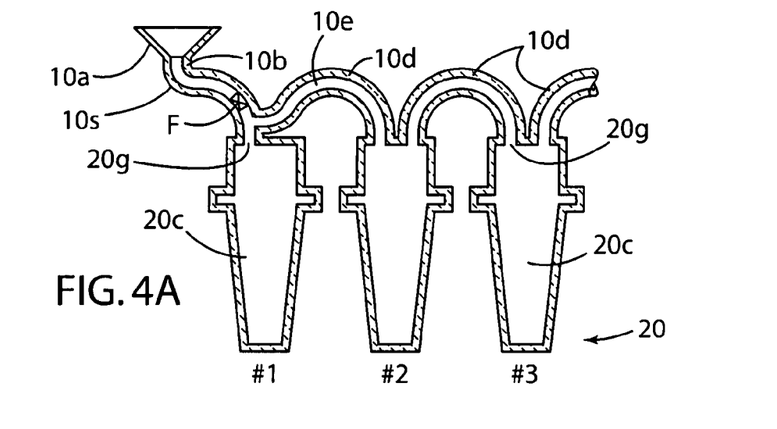
FIG. 4A is a sectional view of an alternative gang mold assembly similar to that of FIG. 4 having the molds connected by arc-shaped sequential melt supply members wherein the first mold and second mold of the series are connected to the melt supply spoke.

FIG. 4A is a sectional view of an alternative gang mold assembly to that of FIG. 4 having the molds 20 connected by arc-shaped sequential melt supply members 10d having passages 10e wherein the first mold #1 and second mold #2 of the series are connected to the melt supply spoke 10s having the melt filter F therein and the subsequent molds #3 and so on are connected in top-to-top manner as described for FIG. 4.

The article-forming mold #1 shown in FIGS. 4 and 4A optionally can be replaced by a faux or false non-articleforming mold of the type described below in connection with FIGS. 5 and 6 and designated as mold #0 in those figures. By faux or false non-article-forming mold is meant that the mold cavity 20*c* of the non-article-forming mold does not have the shape of the article to be cast in the article-forming molds.

Figure 5:
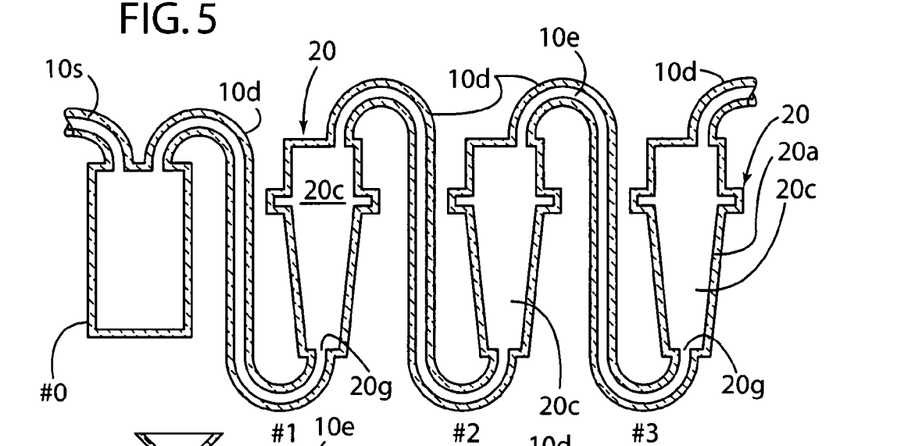
FIG. 5 is an enlarged partial sectional view of a series of molds of a mold assembly having a faux first mold supplied with melt in a manner to collect foreign matter and subsequent article-forming molds connected by sequential melt supply members in top-to-bottom manner to provide flow of molten metal or alloy from the top each mold to the bottom of the next mold with melt flow through each mold cavity from bottom to top in a horizontal sequence of molds.
Figure 6:
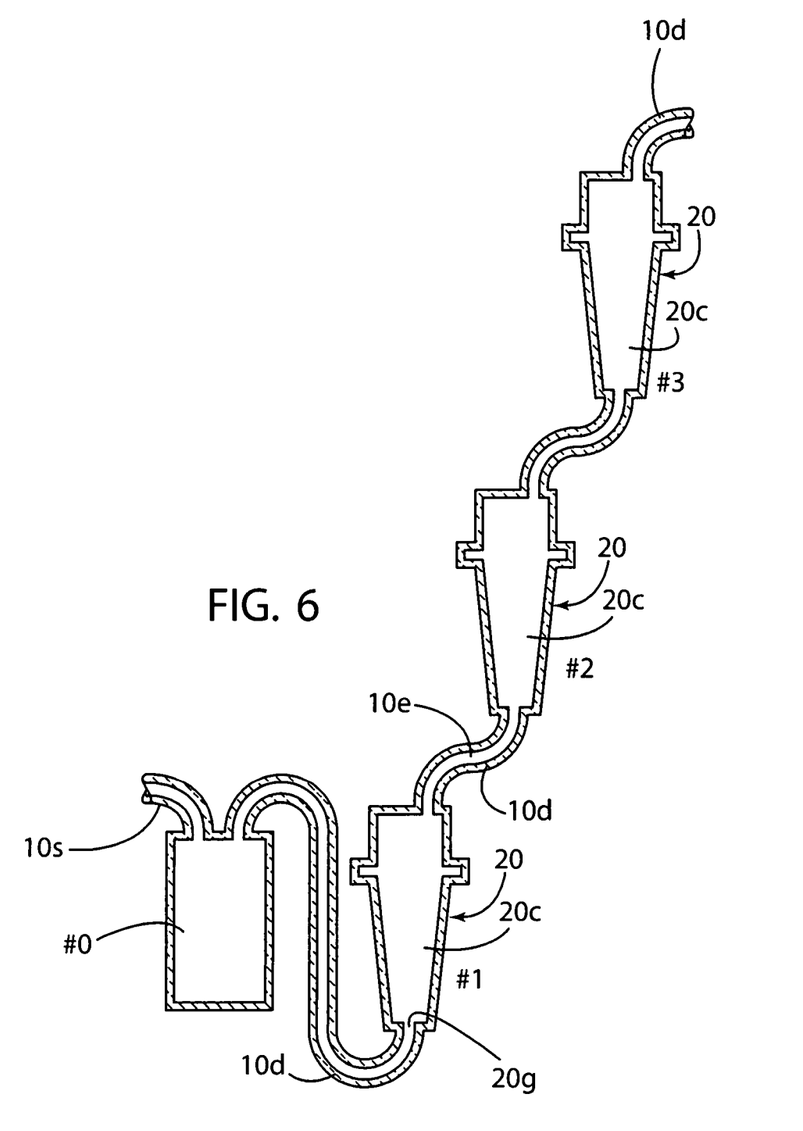
FIG. 6 is an enlarged partial sectional view of still another series of molds of a mold assembly with a faux first mold supplied with melt in a manner to help collect or trap foreign matter and subsequent article-forming molds connected by sequential melt supply members in top-to-bottom manner to provide flow of molten metal or alloy from the top of each mold to the bottom of the next mold with melt flow through each mold cavity from bottom to top in an inclined sequence of molds.

Referring to FIGS. 5 and 6, a mold assembly is shown having a first faux or false non-article-forming mold #0 supplied with melt by gating spoke 10*s* in a dead-end flow manner to help collect or trap foreign matter, such as non-metallic inclusions and dross, and subsequent article-forming molds #1-#3 and so on connected by sequential melt supply members 10*d* in top-to-bottom manner to provide flow of molten metal or alloy from the top each mold to the bottom of the next mold with melt flow through each mold cavity 20*c* in the horizontal or inclined sequence of molds shown in FIGS. 5 and 6, respectively. In each mold cavity 20*c* of molds #1, #2, #3, and so on, the melt flows from bottom to top as a result of the arrangement of the melt supply members 10*d* shown. In FIGS. 5 and 6, the melt flows from the mold cup (not shown) via a passage of the gating spoke 10*s* to the top of the faux or false mold #0. After the faux or false mold #0 is completely filled, the melt flows via passage 10*e* of first melt supply member 10*d* from the top of mold #1 to the bottom of mold #2. The melt flows through the mold cavity 20*c* of mold #2 from bottom to top and then via a second melt supply member 10*d* from the top of the mold #2 to the bottom of the next mold #3 and so on. Although faux or false mold #0 is shown comprising a non-article-forming mold, the first mold can be configured as an article-forming mold for example as shown in FIG. 4.

FIG. 6 differs from FIG. 5 in having the article-forming molds 20 disposed in series sequence at different elevations relative to one another.

Figures 7, 8, 9:
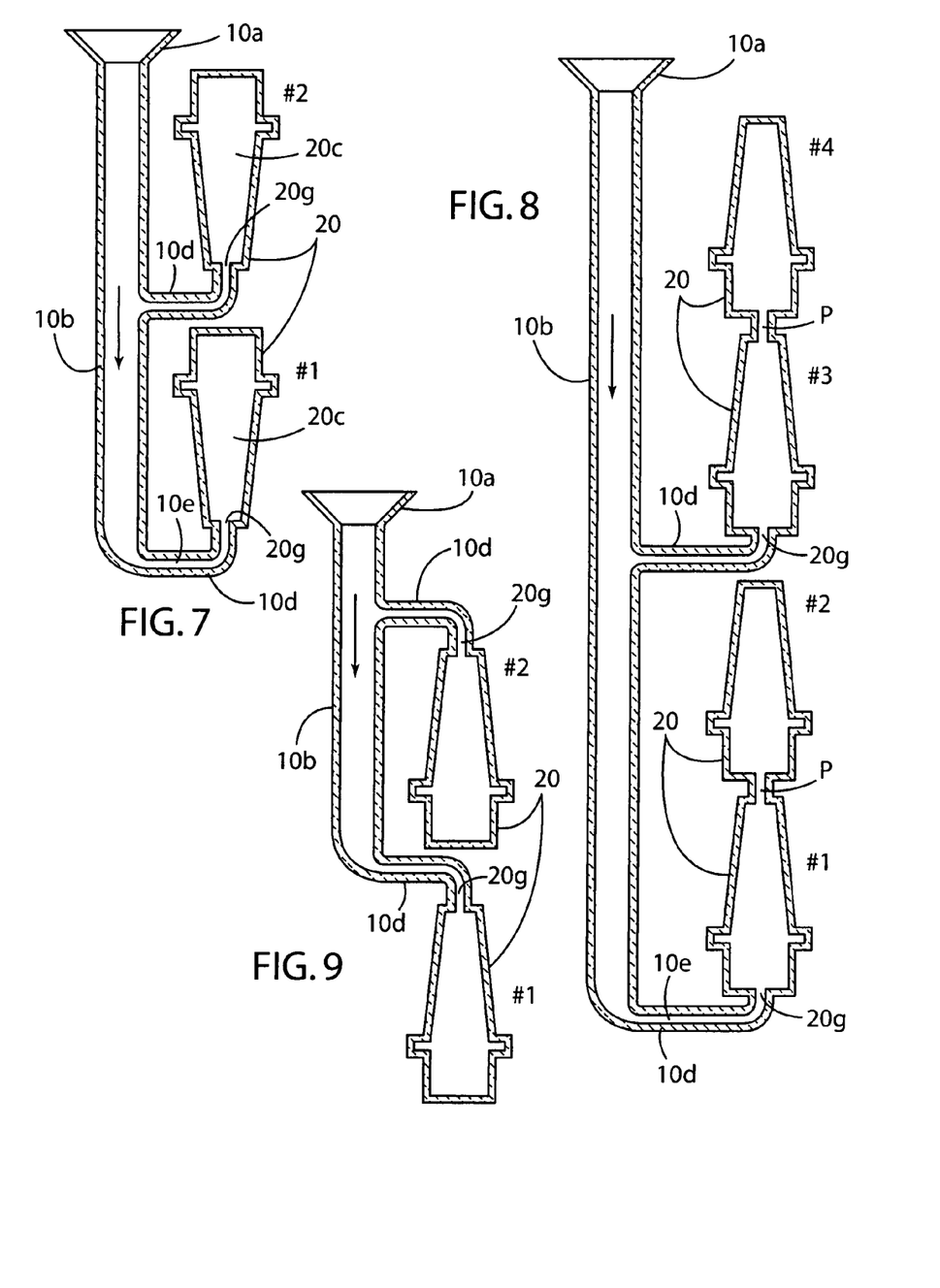
FIG. 7 is a sectional view of a gang mold assembly of another embodiment of the invention having the molds connected by respective sequential horizontal melt supply members to an upstanding down sprue in a manner to provide complete filling of the first mold in the sequence before complete filling of the second mold in the sequence. The molds are shown connected to the top of each melt supply member.
FIG. 8 is a sectional view of a gang mold assembly of another embodiment of the invention having vertically stacked molds connected in melt flow relation to one another and by respective sequential horizontal melt supply members to an upstanding down sprue in a manner to provide complete filling of the first stacked mold in the sequence before complete filling of the subsequent stacked mold in the sequence.
FIG. 9 is a sectional view of a gang mold assembly of another embodiment of the invention similar to that of FIG. 7 having the molds connected to the bottom of respective melt supply members, which are connected to an upstanding down sprue in a manner to provide complete filling of the first mold in the sequence before complete filling of the second mold in the sequence.

FIG. 7 illustrates a gang mold assembly 10 of another embodiment of the invention having the molds 20 connected by a respective mold ingate passage 20*g* to a respective sequential horizontal melt supply member 10*d* having passage 10*e* in melt flow communication to an upstanding down sprue 10*b* in a manner to provide complete filling of the first mold #1 in the sequence before complete filling of the second mold #2 in the sequence. The molds are shown connected to the top of each melt supply member 10*d*. The down sprue 10*b* receives melt from the mold cup 10*a*.

FIG. 8 illustrates a similar gang mold assembly to FIG. 7 of another embodiment of the invention having vertically stacked molds 20 connected in melt flow communication to one another by a connector passage P between the molds. The molds 20 are connected in melt flow communication by a respective mold ingate passage 20*g* to a passage 10*e* of respective sequential horizontal melt supply member 10*d* connected to upstanding down sprue 10*b* in a manner to provide complete filling of the first stacked mold #1 in the lower sequence before complete filling of the second stacked mold #2 in that sequence and so on for molds #3 and #4 in the upper sequence.

FIG. 9 illustrates a similar gang mold assembly to FIG. 7 of another embodiment of the invention wherein the molds 20 have a respective mold ingate passage 20*g* connected to the bottom of the passage 10*e* of respective melt supply members 10*d*, which are connected to an upstanding down sprue 10*b* in a manner to provide complete filling of the first mold #1 in the sequence before complete filling of the second mold #2 in the sequence.

Furthermore, referring to FIGS. 1A-1D and 2, the molds 20 can be disposed along the length of a linear (straight) melt supply member 10*d* that extends from the down sprue 10*b* of the gang mold 10.

Figure 11:
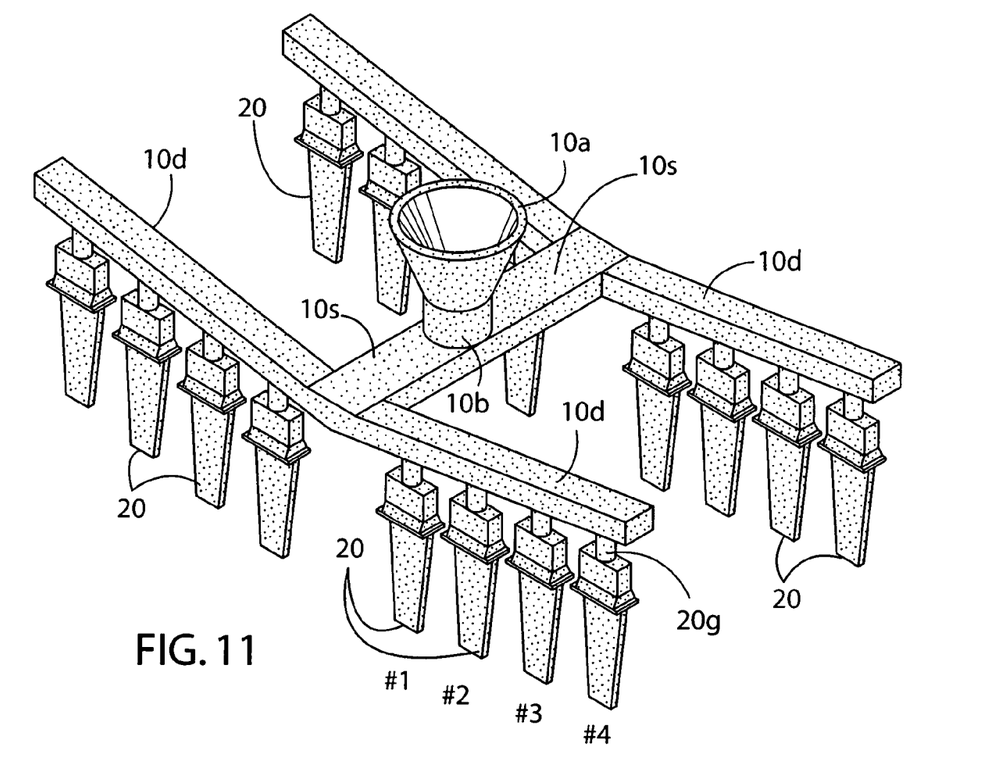
FIG. 11 is a perspective view of another gang mold assembly pursuant to another illustrative embodiment of the invention having a plurality of melt supply members extending in an H-pattern from a down sprue at the bottom of the mold pour cup to provide complete filling of the first mold in each series or sequence before complete filling of the second mold in each series or sequence.
Figure 12:
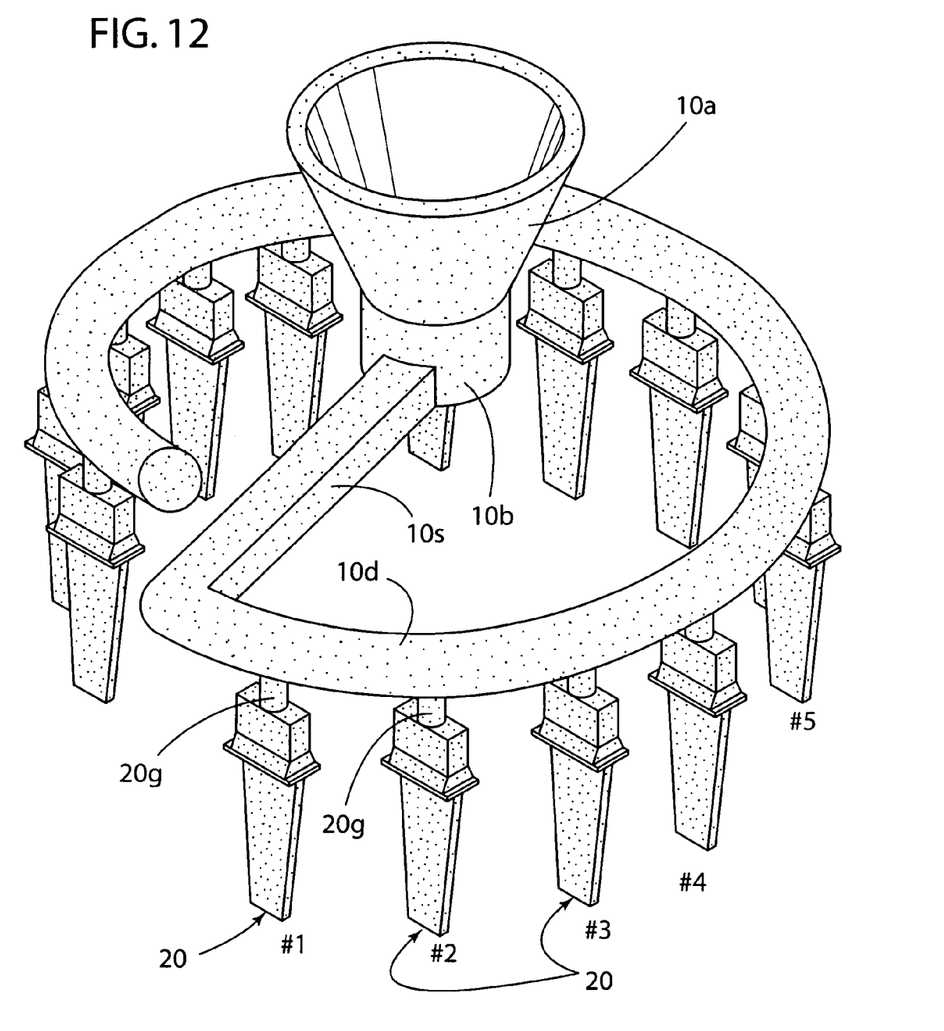
FIG. 12 is a perspective view of still another gang mold assembly pursuant to another illustrative embodiment of the invention having an arcuate melt supply member extending in an inclined spiral from a down sprue at the bottom of the mold pour cup so that each mold in the series is completely filled before the next mold.

Alternately, referring to FIG. 11, the molds can be disposed along the length of a linear (straight), inclined melt supply members 10*d* that extend at an acute angle to horizontal from a cross gating spoke 10*s* in an H-shaped pattern. The cross gating spoke 10*s* is connected in melt flow communication to the down sprue 10*b* of the gang mold 10 to receive molten metal or alloy therefrom and supply the melt to the molds. The invention can be practiced using any suitable pattern of gating members and molds and is not limited to those shown and described herein For example, the molds alternately can be disposed along the length of an arcuate gating member of the gang mold. For example, referring to FIG. 12, the melt supply member 10*d* may extend from a generally radial gating spoke 10*s* connected in melt flow communication to the down sprue 10*b*. The melt supply member 10*d* is shown extending in an upwardly inclined spiral manner about the mold cup 10*a* wherein the molds 20 are connected in melt flow communication to the spiral gating member as shown. The inclined spiral results in filling of the molds 20 in sequence one after another in the direction of inclination of the spiral.

In the above illustrative embodiments of the invention, the molds 20 are shown configured to cast equiaxed articles therein. That is, the molten metal or alloy is introduced into the mold cavities 20*c* and solidified in air, vacuum, or protective atmosphere depending on the metal or alloy being cast to provide an equiaxed grain microstructure in the cast article. The invention is not limited to making equiaxed cast articles and can be practiced to make other cast articles including, but not limited to, directionally solidified columnar grain articles, single crystal articles, composite articles, and others.

Figure 13:
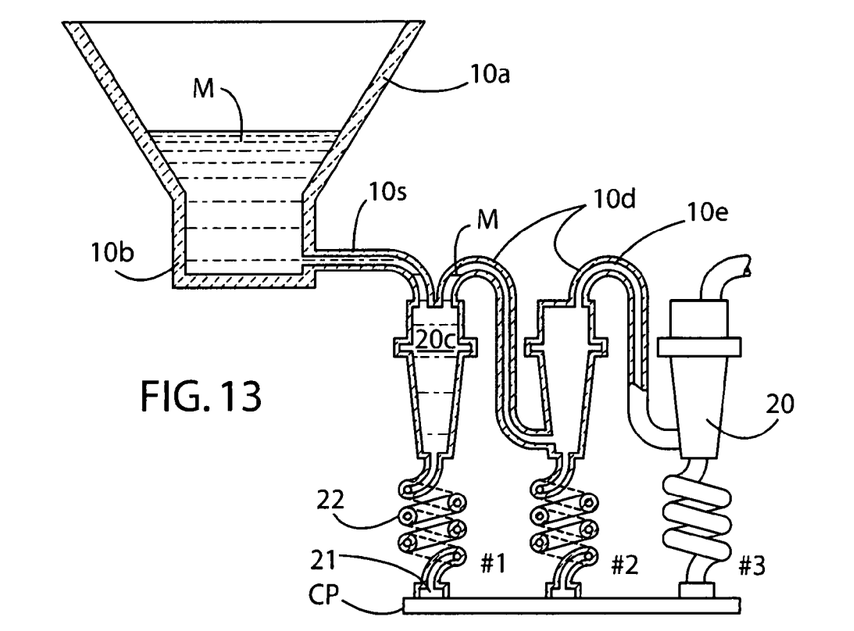
FIG. 13 is a cross-sectional view of still another gang mold assembly pursuant to another illustrative embodiment of the invention having article-forming molds configured for casting single crystal articles and connected by sequential melt supply members in a manner similar to FIG. 5.

For example, referring to FIG. 13, an illustrative gang mold for casting single crystal articles is shown comprising a mold cup 10*a*, down sprue 10*b*, gating spoke 10*s*, and sequential gating members 10*d* of the type described above in connection with FIG. 5 having passages 10*e* for supplying the molten metal or alloy to the molds 20 that are configured to cast single crystal articles. The gating spoke 10*s* can branch into two, three or more branch gating spokes wherein each branch gating spoke connects in melt flow relation to a respective series of molds.

In FIG. 13, the molds 20 each include a grain nucleation chamber 21 closed off by a chill plate CP to provide unidirectional heat removal from the molten metal or alloy in the nucleation chamber, a crystal selector passage 22 such as a "pigtail" passage communicated to the nucleation chamber for selecting a single crystal or grain propagating upwardly therein for further propagation in the molten metal or alloy in the mold cavity 20*c* above the pigtail passage. In lieu of the nucleation chamber 21 and/or "pigtail" passage, a single crystal seed (not shown) can be placed in the mold to nucleate a single grain or crystal for propagation through the mold cavity 20*c*. Mold #1 can be closed at the lower end rather than being communicated to the chill plate as are molds #2-#3 and so on. When the articles are cast by directional solidification to produce directionally solidified columnar grain or single crystal articles, practice of the invention provides improved retained melt heat in the mold grain nucleation chamber 21 to initiate directional solidification.

FIG. 13 differs from prior single crystal casting practice wherein molds have been stacked above a melt supply chamber of the ceramic shell mold supplied with melt from a melt supply spoke of a mold pour cup, wherein the melt supply chamber has been located above a grain selector, such as pigtail, and wherein only the lowermost mold has been connected directly in melt flow communication to the melt supply chamber by a mold ingate passage, the remaining molds above the lowermost mold being connected to the next mold by an upstanding connector passage between the molds. Multiple stacks of molds also have been provided above the melt supply chamber wherein only the lowermost mold of each stack has been connected directly in melt flow communication to the melt supply chamber by a mold ingate passage, the remaining molds above the lowermost mold in each stack being connected to the next mold by an upstanding connector passage between the molds such that the lowermost molds are filled concurrently with melt, then the next highest molds are concurrently filled and so on.

Figure 14:
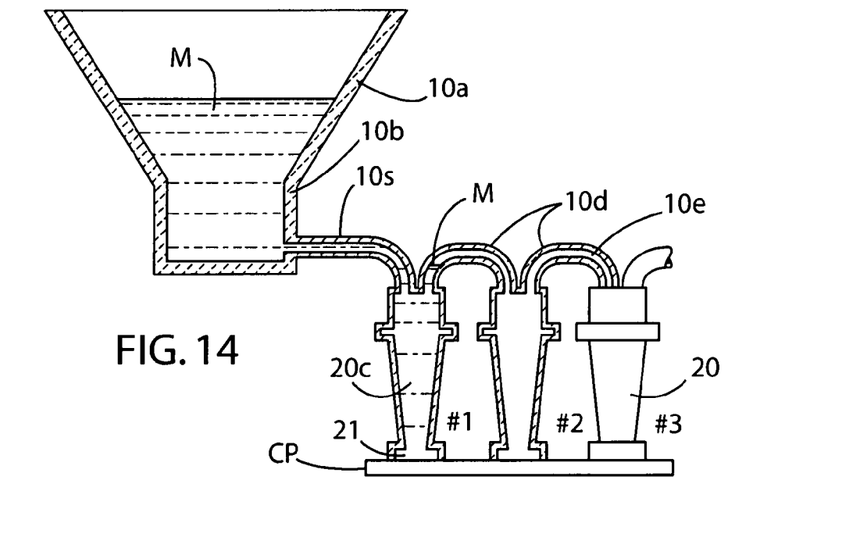
FIG. 14 is a cross-sectional view of still another gang mold assembly pursuant to another illustrative embodiment of the invention having article-forming molds configured for casting directionally solidified, columnar grain articles and connected by sequential melt supply members in a manner similar to FIG. 4 to provide top-to-top cascading flow of molten metal or alloy to fill the molds in sequence.

Referring to FIG. 14, an illustrative gang mold for casting columnar grain articles is shown comprising a mold cup 10a, down sprue 10b, gating spoke 10s and sequential melt supply members 10d of the type described above in connection with FIG. 4 having passages 10e for supplying the molten metal or alloy to the molds 20 that are configured to cast columnar grain articles. In particular, the molds 20 include a grain nucleation chamber 21 closed off by a chill plate CP to provide unidirectional heat removal from the molten metal or alloy in the nucleation chamber. The mold cavity 20c is communicated to the nucleation chamber 21 so that multiple crystals or grains propagating upwardly in the nucleation chamber 21 can be propagated in the molten metal or alloy in the mold cavity 20c to form a columnar grain article. Mold #1 can be closed at the lower end rather than being communicated to the chill plate as are molds #2-#3 and so on.

In the above embodiments, after the molten metal or alloy solidifies in the mold cup, down sprue, gating members, and mold cavities 20c of the molds 20, the mold material can be removed from the metal or alloy casting. The metal or alloy casting comprises the solidified metal or alloy articles formed in mold cavities 20c and connected to the solidified gating which is connected to the down sprue and pour cup The mold material can be removed from the casting in a conventional manner by knock-out operation, vibration, abrasive blasting, chemical dissolution/blasting, or other conventional mold removal processes. The solidified metal or alloy article in the first-filled mold (e.g. faux mold #0 or mold #1 in the figures) can include more non-metallic inclusions present in the molten metal or alloy. The remaining solidified metal or alloy articles formed in the subsequently filled molds (e.g. #2, #3, #4, etc.) can have reduced levels of non-metallic inclusions present therein.

Figure 10:
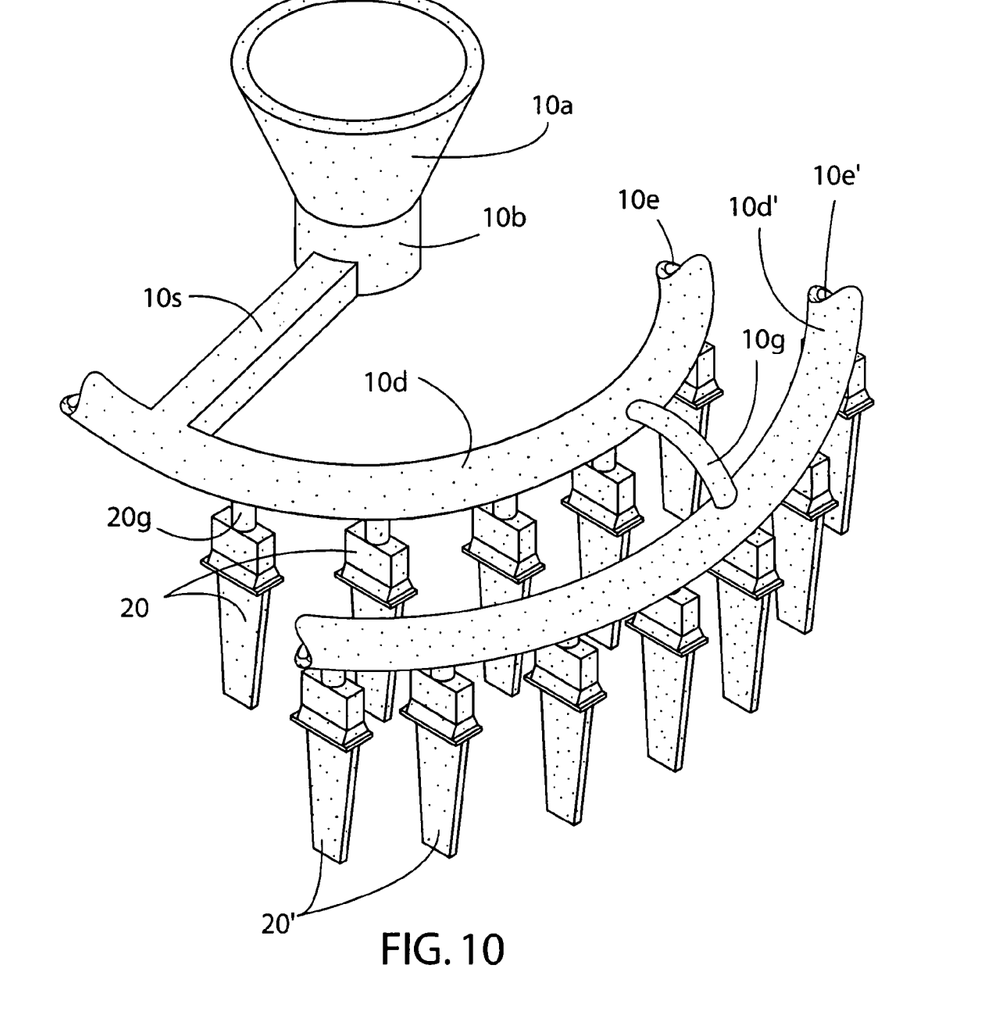
FIG. 10 is a perspective view of a gang mold assembly pursuant to another illustrative embodiment of the invention having a first arcuate melt supply member to which a first plurality of molds are connected in melt flow relation and a second arcuate melt supply member to which a second plurality of molds are connected in melt flow relation. The first and second melt supply members are connected by an arc-shaped third melt supply passage member in a manner that the first plurality of molds are completely or partially filled before the second plurality of molds.

FIG. 10 illustrates a gang mold assembly 10 pursuant to another embodiment of the invention having a mold cup 10a, a down sprue 10b and a generally radial gating spoke 10s in melt flow communication. The gating spoke 10s extends to a first arcuate melt supply member 10d having passage 10e to which a first plurality of molds 20 are connected in melt flow communication. The first arcuate melt supply member is connected in melt flow communication to a second arcuate melt supply member 10d' having a passage 10e' to which a second plurality of molds 20' are connected in melt flow communication. The first and second melt supply members are connected in melt flow communication by an arc-shaped melt supply connector member 10g in a manner that the first plurality of molds 20 are completely or partially filled before the second plurality of molds 20'. The melt supply members 10d, 10d' can be ring shaped or partial rings as shown. Alternately, the melt supply members can be straight or any other configuration. Additional arcuate or straight melt supply members (not shown) can be connected by suitable melt supply connector members (not shown) similar to connector member 10g' to provide a third, fourth, fifth, etc. melt supply members each having respective molds connected in series in melt flow relation thereto.

In practicing the invention, the mold assembly can be cast using a variety of casting processes. For example, the mold assembly can be gravity cast by providing the melt in the mold cup 10a and flowing the melt by gravity to the molds 20, which can be disposed in air, a vacuum, or a protective atmosphere. Moreover, the mold assembly can be cast with gas pressure applied to the melt residing in the mold cup 10a to assist flow to the molds as disclosed for example in U.S. Pat. Nos. 6,019,158 and 6,070,644. Further, the mold assembly can be provided with an exterior glaze layer or coating to reduce mold wall gas permeability, and the melt provided in the mold cup in a vacuum chamber, which is then gas pressurized to assist melt flow to the molds as described in U.S. Pat. No. 6,453,979.

The following Example is offered to further illustrate the invention without limiting the scope thereof.

Example

A ceramic investment shell mold assembly was made to directionally solidify high pressure turbine blades. The mold assembly included a central mold cup into which was poured a commercially available nickel base superalloy (RENE 142) melt under vacuum and superheat of 500 degrees F. The mold cup 10a included six (6) radially extending melt supply spokes 10s each being connected in melt flow communication to a respective one of six (6) respective mold gangs each comprising a first-filled cylindrical faux (non-article-forming) shell mold and ten (10) article-forming (turbine blade-forming) shell molds, which were connected top-to-top in series to one another by arc-shaped melt supply passages in a manner similar to FIG. 4A. The faux mold and the first article-forming mold were connected to each melt supply spoke 10s in a manner similar to FIG. 4A where the cylindrical faux mold resided in the position shown for mold #1 of FIG. 4A and the article-forming molds to form turbine blade castings resided in the positions shown for molds #2, #3 and so on in FIG. 4A. Each faux mold included a cylindrical cross section mold cavity that communicated at its lower end to the chill plate CP. The article-forming molds and the chill plate were similar to that shown in FIG. 14 with the exception that the article-forming molds were arranged in a circular pattern on the chill plate about the mold cup. A conventional mold ceramic filter having 20 ppi (pores per linear inch) was provided in each radially extending melt supply spoke at a location similar to that FIG. 4A.

Multiple mold assemblies of the type described in the preceding paragraph were cast over time using the sequential filling method of the example to make turbine blade castings. The castings formed in the faux molds were cylindrical in shape and not turbine blade castings. The percentage of turbine blade castings scrapped for inclusion scrap was in the range of about 1.2% to 2.5% for the second through tenth turbine blade castings of each of the series of article-forming molds cast by the sequential filling method of the example. For the first turbine blade casting cast in each of the series of molds by sequential filling, the percentage of castings scrapped for inclusion scrap was about 5%. Thus, the second through tenth turbine blade castings of each of the series cast pursuant to the example exhibited a significantly reduced percentage of castings scrapped as compared to the first turbine blade cast in each series.

Although the invention has been described above with respect to certain embodiments, those skilled in the art will appreciate that the invention is not limited to these embodiments since modifications, changes, and the like can be made

We claim:

1. Method for casting molten metal or alloy, comprising providing metal or alloy melt in a melt-containing mold cup of a mold assembly and supplying the melt from the mold cup to a first melt supply passage of the mold assembly to which a first plurality of molds are connected in melt flow communication in series arrangement one after another and supplying the melt from the first melt supply passage via a melt supply connector passage to a second supply passage to which a second plurality of molds are connected in melt flow communication in series arrangement one after another such that the first plurality of molds are at least partially filled before the second plurality of molds.

2. The method of claim 1 including connecting the first melt supply passage in melt flow communication to the second melt supply passage by said connector passage configured in a manner that the first plurality of molds are completely filled before the second plurality of molds.

3. The method of claim 1 wherein the connector passage is configured to have an arc shape.

4. The method of claim 1 including configuring the molds to cast equiaxed polycrystalline grain solidified articles.

5. The method of claim 1 including configuring the molds to cast directionally solidified articles therein having a plurality of columnar grains along an axis of the mold.

6. The method of claim 1 including configuring the molds to cast single crystal articles therein having a single grain.

7. Method for casting molten metal or alloy, comprising providing metal or alloy melt in a melt-containing mold cup of a mold assembly and supplying the melt from the mold cup to a plurality of molds that are connected in melt flow communication at different elevations in series arrangement one after another with the molten metal or alloy being supplied to the bottom of each mold in the series by a melt supply passage extending from the top of the preceding mold in the series.

8. Mold assembly for casting molten metal or alloy melt, comprising a melt-containing mold cup, a melt supply passage in melt flow communication to the mold cup, and a plurality of molds that are connected in melt flow communication to the melt supply passage in series arrangement one after another wherein adjacent molds of the series are connected in melt flow communication by a respective melt supply passage extending from a top region of a preceding mold to a bottom region of a next succeeding mold to provide top-to-bottom molten metal flow relation between adjacent molds, and wherein the respective melt supply passage is configured in a manner that each of the molds of the series is at least partially filled before the next mold in the series is at least partially filled.

* * * * *